United States Patent [19]
Dent et al.

[11] Patent Number: 5,444,415

[45] Date of Patent: Aug. 22, 1995

[54] MODULATION AND DEMODULATION OF PLURAL CHANNELS USING ANALOG AND DIGITAL COMPONENTS

[75] Inventors: Peter Dent; Martin Greenwood, both of Bedford, Great Britain

[73] Assignee: Texas Instruments Incorporated, Dallas, Tex.

[21] Appl. No.: 203,963

[22] Filed: Mar. 1, 1994

[30] Foreign Application Priority Data

Mar. 1, 1993 [GB] United Kingdom ............... 9304074

[51] Int. Cl.⁶ ................. H03B 1/00; H04L 27/12; H04L 27/14
[52] U.S. Cl. ................. 329/302; 329/303; 332/101; 327/106; 375/274; 375/305; 375/328; 375/336
[58] Field of Search ............... 329/300, 301, 302, 303; 332/100, 101, 102; 375/45, 47, 62, 64, 80, 82, 88, 90; 327/106

[56] References Cited

U.S. PATENT DOCUMENTS

| | | | |
|---|---|---|---|
| 3,783,385 | 1/1974 | Dunn et al. | 375/83 |
| 3,824,498 | 7/1974 | McBride | 332/117 |
| 5,084,681 | 1/1992 | Kovalick et al. | 327/106 |

Primary Examiner—Siegfried H. Grimm
Attorney, Agent, or Firm—William E. Hiller; Richard L. Donaldson

[57] ABSTRACT

In the modulation and demodulation of a plurality of frequency separated channels on a radio frequency carrier by digitally coded speech or data, the speech or data is modulated on a digitally generated sub-carrier by quadrature phase shift keying and after conversion to analogue form the modulated sub-carrier is mixed with an RF carrier of fixed frequency to produce the signal for transmission. Reception and demodulation of the transmitted signal are effected by the reverse processes. Frequency multiplication is effected after the digital to analogue conversion by producing analogue samples of very short duration and applying them to a suitable filter. Frequency division during the analogue to digital conversion is effected by sub-sampling.

25 Claims, 8 Drawing Sheets

MODULATION AND DEMODULATION OF PLURAL CHANNELS USING ANALOG AND DIGITAL COMPONENTS

The present invention relates to a method of generation and demodulation of modulated signals, and to radio transmitters and receivers using the method.

Transmitters use an oscillator to generate a carrier signal which either is modulated by a baseband signal to be transmitted or mixed with a previously modulated subcarrier, usually of a lower frequency than the carrier. If it is desired to send signals on a plurality of channels of different frequencies, then either several oscillators running at different frequencies must be provided and selectively switched into service or the oscillator must be capable of being changed in frequency rapidly and accurately. In particular, if a synthesiser is used to produce the oscillation it is difficult to achieve rapid changes of frequency because of the time needed for the frequency stabilisation loop to settle. On the other hand, the provision of several stable oscillators is both spaceconsuming and expensive. A similar difficulty occurs in receivers of superheterodyne construction.

It is an object of the present invention to provide a solution to the above problem.

According to a first aspect of the present invention there is provided apparatus for demodulating a carrier signal having a plurality of channels, occupying separate frequency bands, the apparatus including a constant frequency analogue oscillator for producing an oscillation, analogue combining means for combining the oscillation with the carrier signal to produce an intermediate frequency signal carrying the channels in separate frequency bands of lower frequencies than in the carrier signal, analogue to digital conversion means for converting the intermediate frequency signal into a first digital signal, and a channel processing unit comprising a digital oscillator, responsive to a channel select signal, for producing samples of a substantially periodic signal of the frequency of the selected channel in the first digital signal or a sub-multiple of that frequency, and digital combining means for combining samples of the substantially periodic signal with samples of the first digital signal so as to produce demodulated signal.

According to a second aspect of the present invention there is provided apparatus for demodulating a carrier signal having a plurality of channels, occupying separate frequency bands, the apparatus including an analogue oscillator for producing an oscillation, combining means for combining the oscillation with the carrier signal to produce an intermediate frequency signal carrying the channels in separate frequency bands of lower frequencies than in the carrier signal, analogue to digital conversion means for converting the intermediate frequency signal into a first digital signal, the analogue to digital conversion means having a sampling rate such that the first digital signal carries the channels in separate frequency bands of lower frequencies than in the intermediate frequency signal, and a channel processing unit comprising a digital oscillator for producing samples of the substantially periodic digital signal, and digital combining means for combining samples of the substantially periodic digital signal with samples of the first digital signal so as to produce a demodulated signal.

According to a third aspect of the present invention there is provided a method of demodulating a carrier signal having a plurality of channels, occupying separate frequency bands, the method including combining the carrier signal with a local oscillation so as to produce an intermediate frequency signal carrying the channels in separate frequency bands of lower frequencies than in the carrier signal, sampling the intermediate frequency signal and converting the samples into digital form so as to form a first digital signal and combining the first digital signal, with a substantially periodic signal in digital form, of the frequency of a selected channel in the first digital signal, or a sub-multiple of that frequency, so as to produce a demodulated signal.

According to a fourth aspect of the present invention there is provided an oscillator which, in use, produces alternately, at times determined by a clock signal, samples of two different phases of a periodic waveform, the oscillator comprising a memory containing a plurality of addresses at which are stored values representing the amplitude of the waveform at points distributed over at least a part of a period of the waveform during which the waveform assumes all possible values of the amplitude of the waveform and addressing means for reading selected ones of the stored values from the memory, the means including register means for storing an address signal for application to the memory, an adder connected to add the value of the address signal in the register means to the value of an increment signal to produce the value of the next address signal, and to store the next address signal in the register means, and increment means connected to provide as the increment signal alternately a first value representing the phase shift between the two phases and a second value representing the phase shift between the two phases in the opposite sense plus a value representing the phase increment between consecutive samples of each phase of the waveform produced by the oscillator.

According to a fifth aspect of the present invention there is provided apparatus for producing a modulated carrier signal, including a digital oscillator for producing samples of a periodic subcarrier waveform having a frequency determined by a channel select signal, digital combining means for combining the samples of the subcarrier waveform with a modulation signal in digital form to produce a first digital signal carrying the modulation signal in a band at the frequency of the subcarrier frequency, digital to analogue conversion means for converting the first digital signal into a first analogue signal, a constant frequency analogue oscillator for producing a carrier signal, and mixing means for combining the first analogue signal with the carrier signal to form the output modulated carrier signal.

An embodiment of the invention will now be described with reference to the accompanying drawings, of which.

By way of example only a transmitter and a receiver for use in a CT2 cordless telephone will be described. In CT2 telephone systems base stations are located at prominent public spaces such as stations, street corners and the like. Users of the system have a CT2 handset which they use to gain access to the public telephone network via a radio link with a base station. A base station is capable of working with several users simultaneously.

The CT2 telephone system uses 40 channels spaced at 100 kHz intervals in a band of radio frequencies between 864 and 868 MHz. In CT2 systems digitally coded speech or data is conveyed using frequency shift keying (FSK) according to a particular specification. In the example to be described the transmitter employs a particular subset of FSK called minimum shift keying (MSK), and operation of the receiver is described with reference to an MSK signal being received, although it is capable of receiving and demodulating a range of FSK signals.

CT2 is a half duplex system, transmission from a base station to a handset and in the reverse direction taking place in alternate 1 ms bursts.

Figure 1:
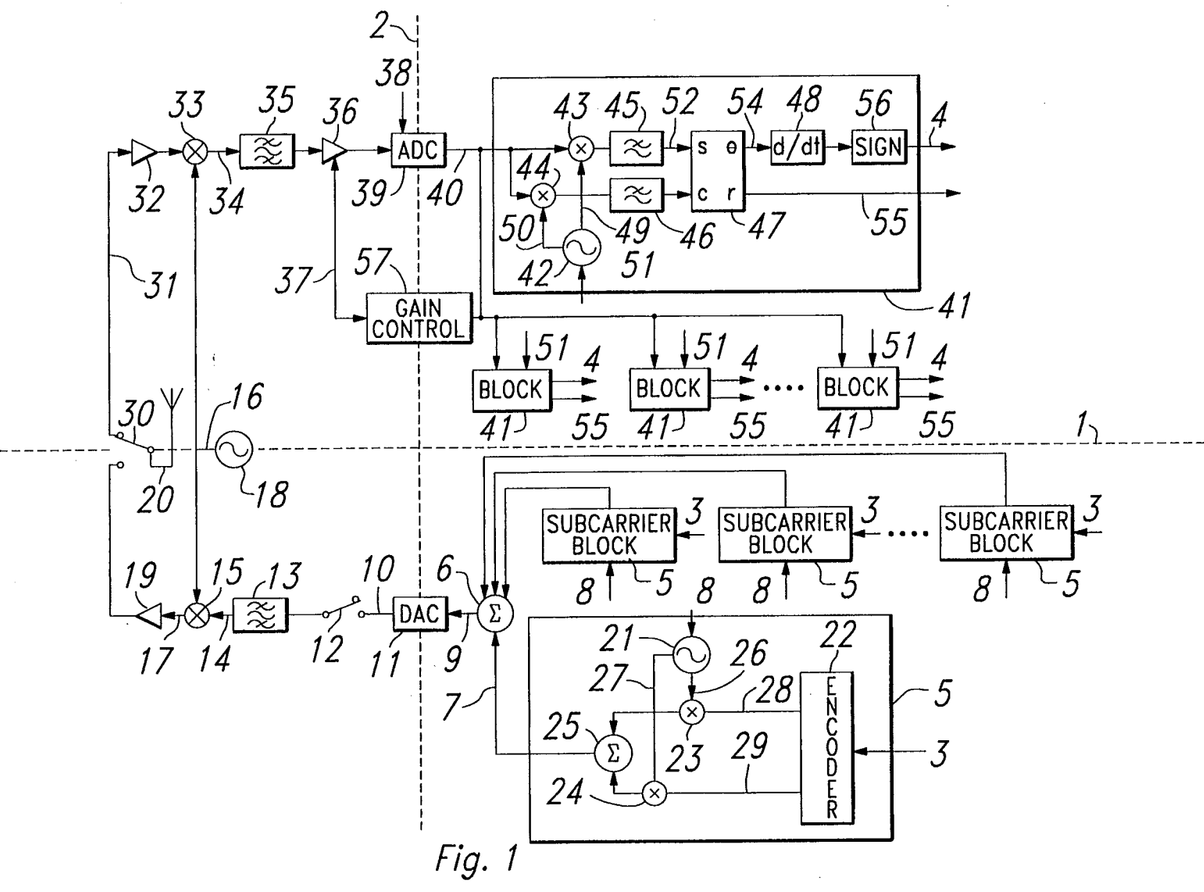
FIG. 1 shows in block diagrammatic form one example of a circuit suitable for use in a base station of a CT2 cordless telephone.

FIG. 1 is a block diagram of a circuit according to the present invention, which is suitable for use in the base station of a CT2 cordless telephone. As will be described below, a very similar circuit may be used in a CT2 handset.

The diagram is divided into four parts by dashed lines 1 and 2. The two parts of the circuit above dashed line 1 are used for receiving and demodulating radio signals and those below the dashed line 1 are for modulating and transmitting radio signals. The circuitry of the two parts of the diagram to the left of dashed line 2 is constructed of analogue components and the circuitry of the two parts to the right is constructed of digital components.

In the digital half of the circuit the conductors carrying digital signals between the various blocks are shown, for simplicity of illustration, as single lines. However, a single line in the diagram may represent in the actual circuit several conductors in parallel each carrying different bits of the digital signals.

The circuit transmits the digital data streams, present on conductors 3, on the forty channels of the CT2 radio frequency band between 864 and 868 MHz. The circuit also receives and demodulates that radio frequency band to produce on conductors 4 digital data streams present on channels of the radio frequency band. The digital data streams comprise $72 \times 10^3$ 1-bit values per second.

As noted above, CT2 is a half duplex system in which transmission and reception take place alternately in 1 ms bursts. Therefore the digital data streams provided on conductors 3, in the circuit of FIG. 1, need to be provided in 1 ms bursts of samples that occur while it is transmitting. Similarly the circuit produces as output digital data streams on conductors 4 in 1 ms bursts of samples that occur when it is receiving.

Now since the digital data streams usually comprise digitally encoded speech the bursts are buffered, on transmit and receive, by burst mode devices, so as to interface with streams of evenly spaced samples, so that to the user of a CT2 telephone the system gives the impression of being full duplex.

The transmitter (lower) half of the circuit will be described first. The digital part of the transmitter consists of several subcarrier blocks 5 and an adder 6. A plurality of digital data streams that are to be transmitted simultaneously are fed respectively to different ones of the subcarrier blocks 5. Each subcarrier block produces in response to the particular data stream applied to it, a digital signal in the form of a sequence of digital values, on a set of conductors 7, representing successive instantaneous amplitudes of a modulated subcarrier signal.

When in use, each subcarrier block 5 is connected to receive on one of conductors 8 a channel select signal and it is this signal which operates to select the frequency of the subcarrier produced by that subcarrier block. Where several modulated subcarriers are produced, by different subcarrier blocks 5, their frequencies are different and lie in the range from 1 MHz to 5 MHz. If there are more subcarrier blocks 5 than digital data streams to be transmitted then the spare subcarrier blocks receive a channel select signal that causes them to produce a constant zero signal.

The subcarrier blocks 5 each include a subcarrier oscillator which generates sequences of ten-bit digital values at a rate of $12.8 \times 10^6$ values per second representing instantaneous amplitudes of a sine wave of the subcarrier frequency allocated to that block. The values are generated from a look-up table held in a ROM, one value being generated for each cycle of a 12.8 MHz clock signal. It is the order in which the values are looked up and hence the frequency of the subcarrier that is determined by the channel select signal. The details of the generation of the subcarrier and its modulation are described below.

The modulated digital subcarriers produced by the subcarrier blocks 5 are added together by adder 6 to produce a combined modulated subcarrier signal which is represented by a digital signal on conductors 9.

The digital signals representing the modulated subcarriers and the combined modulated subcarrier signal also comprise $12.8 \times 10^6$ samples per second of 20 and 32 bits respectively, although 10 bits would be sufficient to carry the information in each signal. The adder 6 therefore adds together one sample from each digital representation of the modulated subcarriers to form a single sample of the digital representation of the combined modulated subcarrier signal.

The combined modulated subcarrier signal in digital form is converted to analogue form on conductor 10, by a digital to analogue converter 11, and that signal is then chopped by sampler 12 at 12.8 MHz to form a train of pulses. The pulses are of very short duration, about 7 ns, and are applied to a bandpass surface acoustic wave filter (SAW) 13 which selects a band of frequencies from 65 to 69 MHz. Those frequencies are the fifth harmonic of the pulse rate plus the 1 to 5 MHz of the combined modulated subcarriers, the short duration of the pulses ensuring that the signal at the input of the SAW 13 contains a high proportion of energy at the fifth harmonic.

The output of filter 13, on conductor 14, is an intermediate frequency signal of 65 to 69 MHz which has modulated on it the digital data streams present on conductors 3.

The intermediate frequency signal is mixed by a mixer 5 with a carrier on conductor 16 to produce, on conductor 17, a radio frequency signal to be transmitted. The carrier is produced by a local oscillator 18 and has a frequency of 799 MHz. Before transmission the radio frequency signal is amplified by a power amplifier 19, that is tuned so that only the upper sideband between 864 and 868 MHz is passed to antenna 20 for radiation.

Referring again to the digital part of the transmitter, each subcarrier block 5 includes a subcarrier oscillator 21, a minimum shift keying encoder 22, first and second multipliers 23,24 and an adder 25.

The subcarrier oscillator 21 produces respectively on conductors 26,27 digital representations of two orthogonal phases of a selected subcarrier oscillation. The oscillation is a sine wave and has a frequency determined by the channel number, n, of the channel select signal applied to the subcarrier oscillator, on conductor 8, of $(1.2+0.1 n)$ MHz, n being an integer between 0 and 39 inclusive. Each digital representation comprises $12.8 \times 10^6$ digital values per second, each value being of ten bits.

Figure 7A:
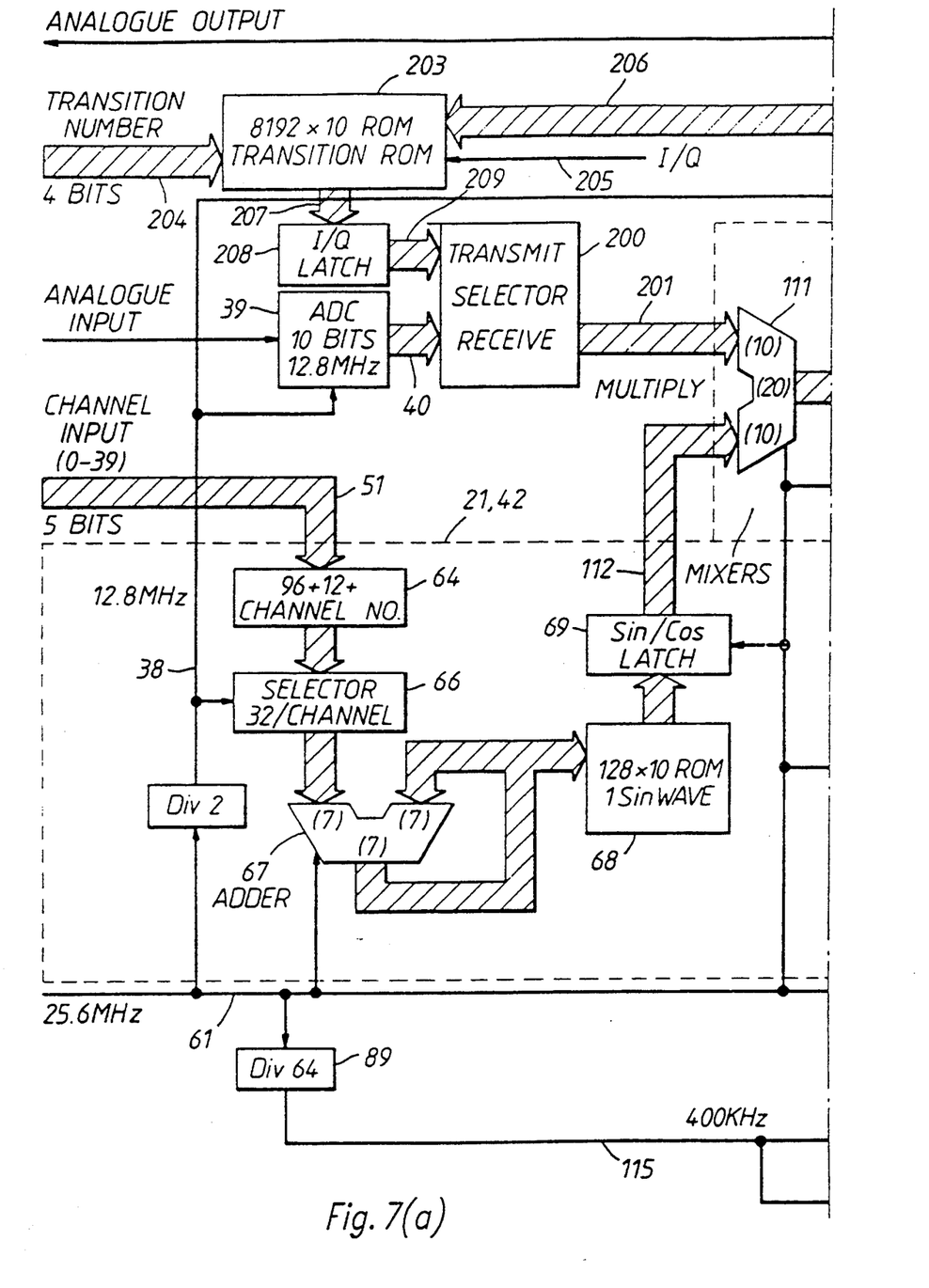
FIG. 7 shows a modified form of the diagram of FIG. 3.
Figure 7B:
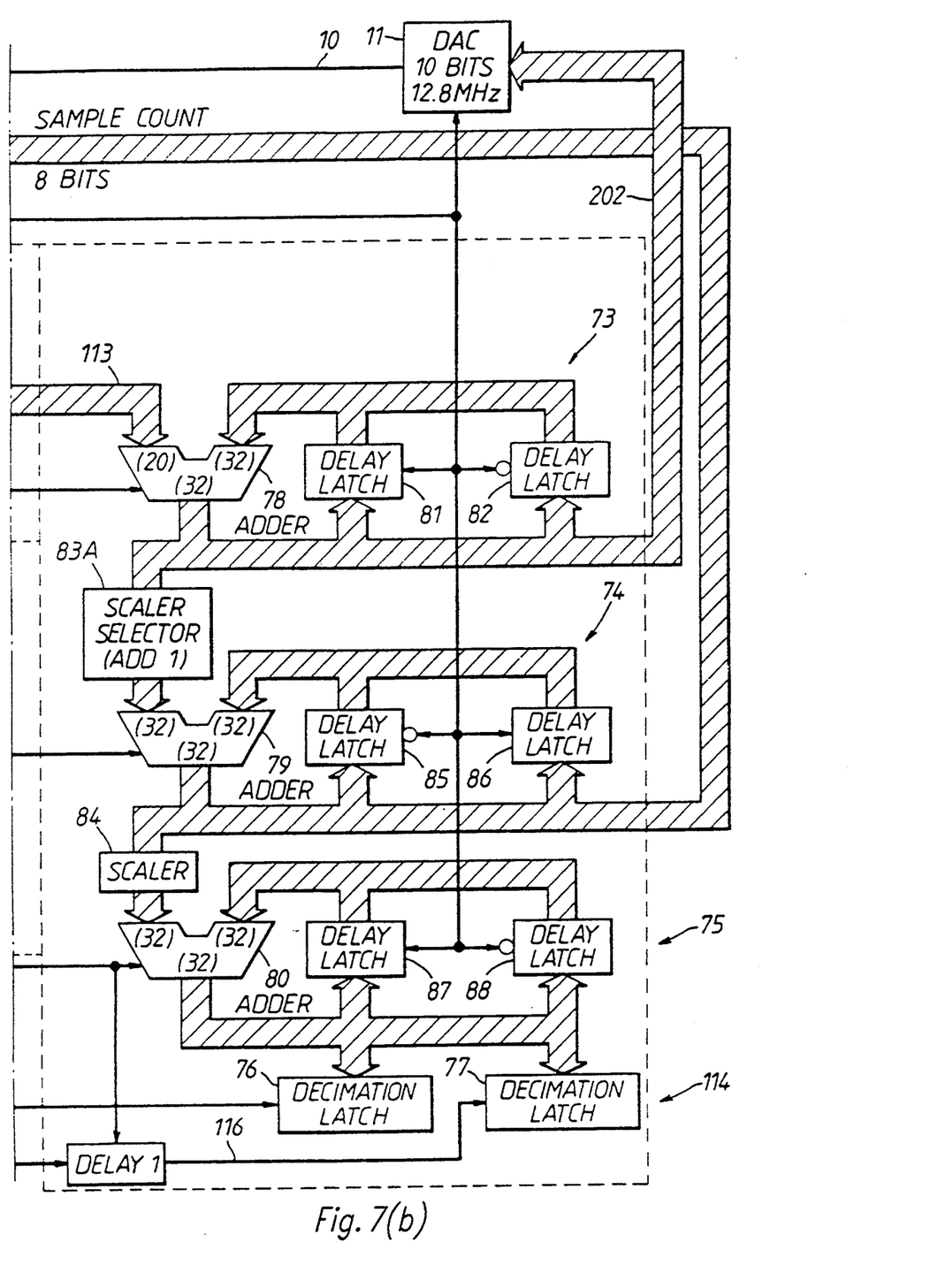

The subcarrier oscillator 21 includes a clocked ROM. It is of similar construction to and may be the same component as the oscillator 42 of the receiver half of the circuit; the construction of the oscillator 42 is described in detail below with reference to FIG. 3. FIG. 7 shows the connection to other parts of the circuit of the oscillators 21 and 42 when combined into a single component.

Each subcarrier block, in use, performs a kind of phase modulation, known as minimum shift keying. That kind of modulation involves advancing the phase of its subcarrier by 90° in response to each "1" received from the digital data stream and retarding it by 90° in response to each "0". That is achieved by adding together proportions, that vary with time, of the two phases of the selected subcarrier oscillation. The proportions are controlled by I and Q values respectively present on conductors 28 and 29. Those values both occur at the same rate as the values of the digital representations of the phases of the selected subcarrier oscillation. The control of the proportions takes the form of, for the first phase, multiplying together in the multiplier 23 respective values of that phase and of the I values. Similarly the values of the second phase are multiplied by the Q values using the multiplier 24. Corresponding values of the resulting streams are added together by the adder 25.

The I and Q values are produced by the minimum shift keying encoder 22, in response to the "1"s and "0"s of the digital data stream on conductor 3. Each pair of one I value and one Q value produced is a signal vector and that signal vector is caused to rotate through +90° during each "1" of the digital data stream and through −90° during each "0". Since the bits of the digital data stream occur at a rate of $72 \times 10^3$ per second, it takes 177 or 178 $(=12.8 \times 10^6/72 \times 10^3)$ pairs of one I value and one Q value for the vector to rotate through 90°. In the same time the phase of the modulated subcarrier produced by the subcarrier block 5 is advanced or retarded by 90° with respect to any particular phase of the selected subcarrier oscillation.

The minimum shift keying encoder 22 generates the I and Q values from a look-up table in a ROM. For each bit received the encoder 22 steps through the values in the ROM in an order determined by the value of that bit and also by the final I and Q values for the previous bit.

The CT2 standard requires that when a waveform for a channel has been produced it should be passed through a filter with a Gaussian frequency response. In this transmitter the same effect is achieved without requiring a filter by making an appropriate selection of the values for the look-up table and by making the order in which those values are stepped through dependent on the value of the previous bit received on conductor 3.

The receiver (upper) half of the circuit receives and demodulates one or more data streams present on one or more of the forty channels in the radio frequency band between 864 and 868 MHz received on antenna 20. The radio frequency signals received may have been generated by a transmitter having a transmission circuit similar to that of the transmission half of the circuit of FIG. 1. Different channels within the radio frequency band may have been transmitted by different transmitters. In a CT2 system a base station may receive signals from several handsets each transmitting on a different channel.

The use of the antenna 20 is divided between the transmitter and receiver halves of the circuit by a switch 30; transmission and reception do not take place at the same time.

The radio frequency signals received by the antenna 20 are conveyed via the switch 30 and a conductor 31 to a tuned low-noise amplifier 32 and are then mixed, by a mixer 33, with a carrier wave having a frequency of 799 MHz generated by the oscillator 18. The oscillator 18 produces the same frequency for, and is used for, both transmission and reception. The oscillator is not therefore required to have a particularly short settling time but it should be stable to within about 5 kHz of 799 MHz.

The mixing performed by mixer 33 translates the radio frequency signals received into an upper intermediate frequency band between 65–69 MHz on conductor 34. The tuning of tuned low noise amplifier 32 is such that it attenuates any radio frequency signals received in the range between 730 and 734 MHz in order to eliminate image interference. Any signals having frequencies outside the band 65–69 MHz are removed from the upper intermediate frequency band by a band-pass surface acoustic wave filter 35. The upper intermediate frequency band is then amplified, by an amplifier 36 having its gain set by an automatic gain control signal on a conductor 37. The amplified signal is then converted to digital form by an analogue to digital converter 39 which samples the analogue signal at a rate of 12.8 MHz and then converts the samples into 10-bit digital words. Because the sampling frequency is much lower than the intermediate frequency the conversion to digital form has the effect of aliasing the signal with the result that the forty channels that were in the frequency band from 65 to 69 MHz are shifted to a band between 1 and 5 MHz. The digital signal output of the converter 39, which appears on the conductors 40 is termed the lower intermediate frequency signal.

Note that while the analogue to digital converter 38 of the receiver half of the circuit of FIG. 1 shifts the frequency band of the analogue signal as well as performing the analogue to digital conversion, the digital to analogue converter 11 of the transmitter half of the circuit performs only the digital to analogue conversion and does not shift the frequency band of the signal it processes. As has been explained above, the sampler 12 in conjunction with the filter 13 effects the frequency shift of the signal into the 65 to 69 MHz band.

The lower intermediate frequency signal on conductors 40 is then fed as input to one or more blocks 41, each of which filters, demodulates and decodes one channel to reproduce the digital data stream carried by that channel.

Each block 41 has a local oscillator 42, two multipliers 43,44, two low pass filters 45,46, a rectangular to polar converter 47, a differentiator 48 and a sign block 56. All of the components in the blocks 41 operate with digital values in the form of parallel words of at least 10 bits.

The local oscillator 42 produces sine wave values in two phases at 49 and 50, having a frequency which is determined by a channel select signal on a conductor 51. The first or sine phase 49 is in quadrature with the second or cosine phase 50. The two phases 49,50 are multiplied by the lower intermediate frequency signal in the multipliers 43 and 44. The multiplication and subsequent processing in the block 41 serve to demodulate the selected channel, which has its centre frequency equal to the frequency of the sine and cosine waves produced by the local oscillator 42 so that the multiplication and subsequent processing bring the selected channel down to baseband. The other channels present in the lower intermediate band 40 are also shifted in frequency but not to baseband and are blocked by the low pass filters 45 and 46 respectively.

The two phases 49,50 of the local oscillator are in quadrature so that the outputs of low pass filters 45,46 are the quadrature components 52,53 of a baseband signal that corresponds to the signal vector represented by the I and Q values 28,29 at the transmitter. That baseband signal does not necessarily have the same phase as the signal vector in the transmitter that transmitted the signal received by the receiver, because in general the local oscillators in that transmitter and in the receiver are not in phase with each other. However, since it is the changes in phase of the signal vector 28,29 and the baseband signal 52,53 and not the absolute values of their phases that represent the digital data the digital data stream-transmitted can be recovered.

The baseband signal is decoded first by converting its quadrature components 52,53 into signals representing its phase 54 and its amplitude 55 using the rectangular to polar converter 47. The phase is then differentiated with respect to time by the differentiator 48. Lastly, the digital data stream 4 is recovered by sign block 56 which produces a "1" if the phase signal 54 is increasing, that is if the output of differentiator 48 is positive, and produces a "0" if the phase signal is decreasing, that is if the output of differentiator 48 is negative.

The recovered digital data stream 4 has a data rate of 72 Kbits per second which is much smaller than the $12.8 \times 10^6$ samples per second produced by the analogue to digital converter 39. How that rate change is effected in the block 41 will be explained below with reference to FIGS. 3 and 5.

If it is required to recover from several channels the respective digital data streams at the same time then a plurality of blocks 41 must be provided, each being supplied respectively with a different channel select signal 49 which causes each block 41 to demodulate and decode a different channel.

If the analogue to digital conversion performed by converter 39 is to result in as much information as possible being passed to the blocks 41 then the lower intermediate frequency signal should at its maxima approach the largest value that can be held in one of the 10-bit words of that signal. To achieve that the gain control block 57 monitors the level of the lower intermediate frequency signal on conductors 40 and provides an automatic gain control signal, on conductor 37, at an appropriate level. That gain control block 57 adjusts the automatic gain control signal once for each reception burst.

Since the received signal has been modulated, for example by a transmitter such as that shown in the lower half of FIG. 1, by MSK or FSK which is frequency modulation, the amplitude of the signal on the conductors 55 will be approximately constant. Variations in the level of that signal may be caused by noise or by variations in strength of the signal received at antenna 20, due to changes in the signal path between the transmitter and the receiver. Weaker signals generally have a greater error rate and so the amplitude of the signals, on conductors 55, gives an indication to the receiver of the likely error rate in the output digital data stream. That information is used, inter alia, in the decision of whether to allocate a new channel to a telephone call. Generally the 10-bit words of the lower intermediate frequency signal provide enough resolution to allow signals in different channels of different strengths to be successfully received.

Figure 2:
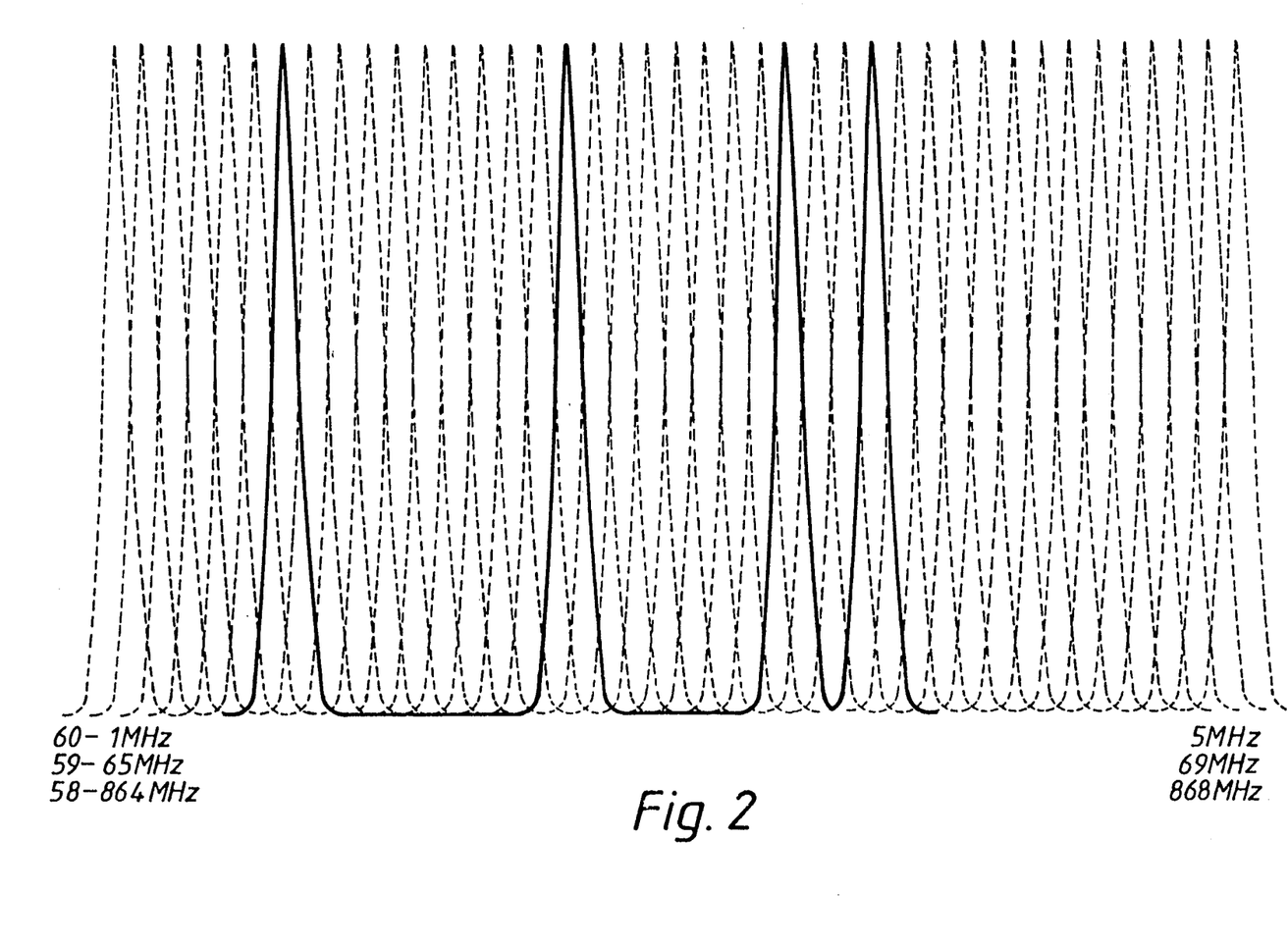
FIG. 2 shows the frequency spectrum on three frequency scales of four of the forty channels used by the circuit of FIG. 1.

FIG. 2 shows the frequency spectrum of the signal present or represented by digital samples at various points of the circuit when 7th, 17th, 25th and 28th channels of the CT2 band are in use. The dotted spectra show the contributions that would be made by the other channels if they were in use.

The three pairs of frequencies marking the ends of the spectrum represent at 58 the radio frequency transmitted signal, at 59 the interval intermediate frequency signals, and at 60 the combined digital signals.

Both the receiver and the transmitter of a base station can include circuitry for any number of channels between one and forty, and the subcarrier block 5 and block 41 for the or each channel may be tunable to the frequency allocated to any one of the forty channels of the CT2 band. In a typical handset the transmitter and receiver have facilities for a single channel only, but that channel can be selected to be any one of the 40 channels; the means for effecting that selection, that is some means for generating the channel select signal, are outside the scope of this invention and will not be described.

Figure 3:
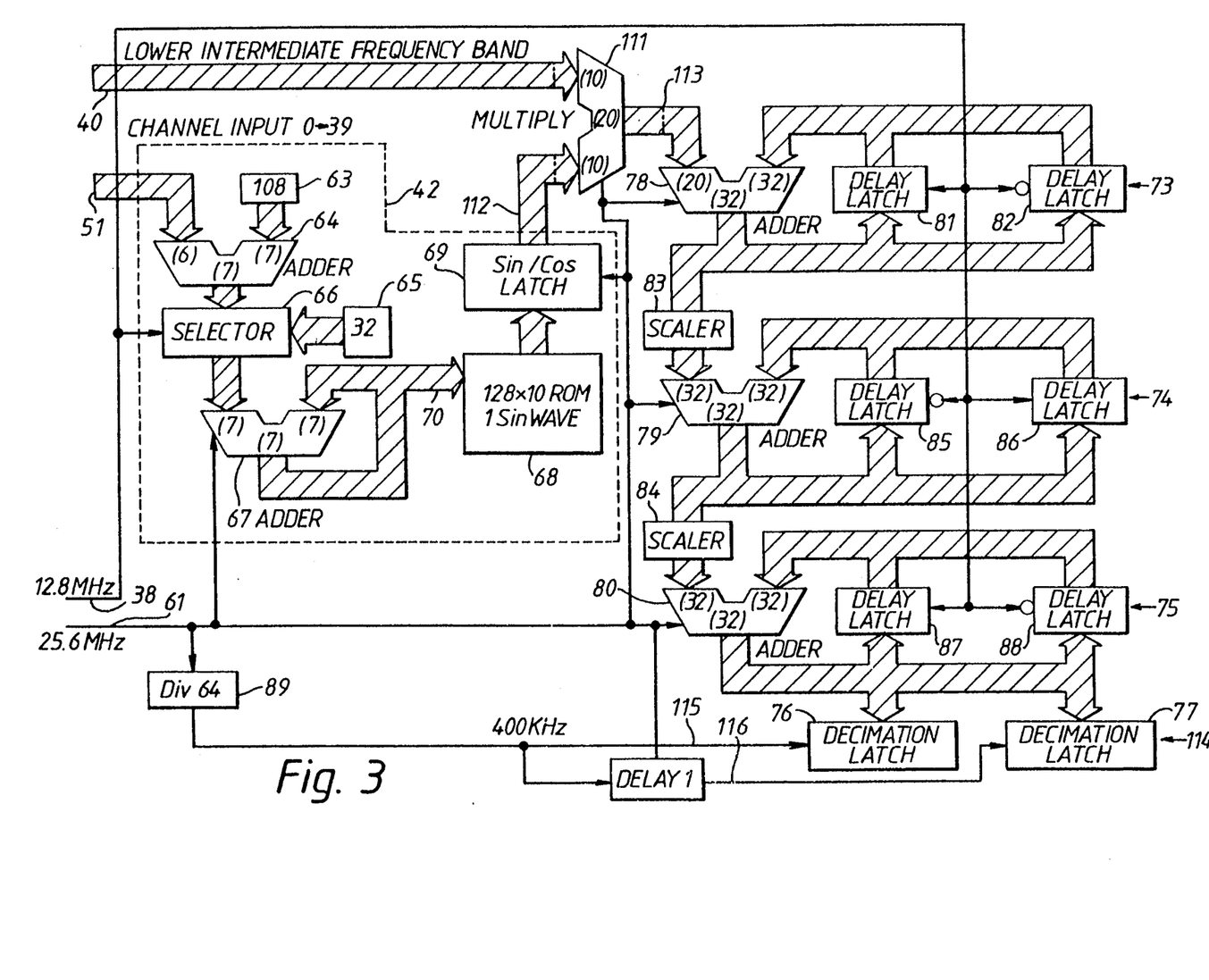
FIG. 3 is a block diagram showing in more detail parts of the block 41 of FIG. 1 for performing some of the signal processing in that block.
Figure 4A:
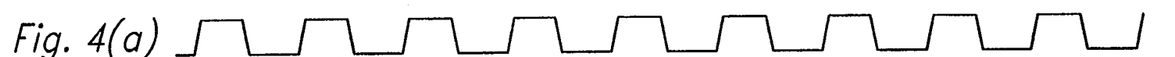
FIG. 4 shows some of the signals that occur in the circuit of FIG. 3.
Figure 4B:
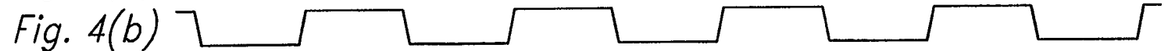
Figure 4C:
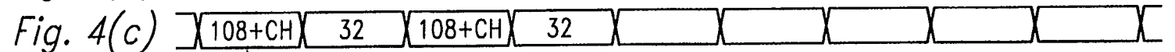
Figure 4D:
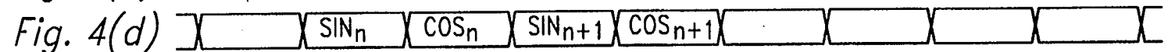
Figure 4E:
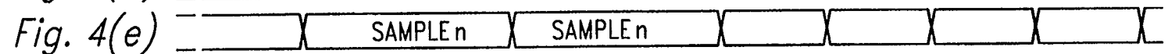
Figure 4F:
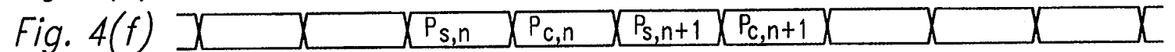
Figure 4G:
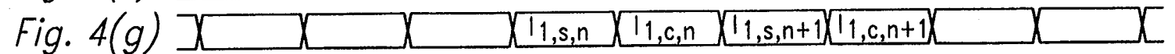
Figure 4H:
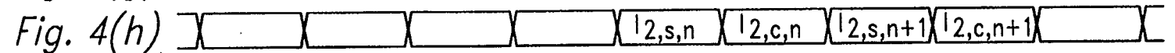
Figure 4I:
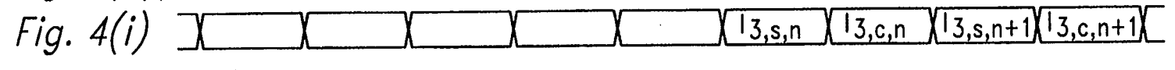

FIG. 3 is a diagram of a circuit that performs the functions of part of a block 41 of FIG. 1. In particular, it performs the functions of the local oscillator 42, and the multipliers 43 and 44 and part of the functions of the low pass filters 45 and 46. In FIG. 3 the blocks contained by box 42 form the local oscillator 42. Although FIG. 1 shows the block 41 having two multipliers, one to deal with each of the two quadrature components of the channel selected for that block, the circuit of FIG. 3 has only a single multiplier 201, the use of which is multiplexed between the two quadrature components. The rest of the blocks of FIG. 3 perform part of the functions of low pass filters 45 and 46 but again the use of several of those blocks is divided in time between the quadrature components. As mentioned above the oscillator 21 is of similar construction to the oscillator 42, but for simplicity the following description will be restricted to the operation of the oscillator 42.

The blocks forming the local oscillator 42 operate, in response to the channel select signal received on conductors 51, to produce on conductors 112 samples of sine and cosine waves of the frequency of the selected channel alternately from a sin/cos latch 69. The samples are produced at a rate of $25.6 \times 10^6$ per second, controlled by clock signal 61; those samples are $12.8 \times 10^6$ sine samples per second and $12.8 \times 10^6$ cosine samples per second. The samples are multiplied by the samples of the lower intermediate frequency signal received on conductors 40 from the converter 39. The samples of the lower intermediate frequency signal occur at a rate of $12.8 \times 10^6$ per second; each such sample is first multiplied by a sample of the sine wave using multiplier 111 to form a product which is output on conductors 113, and the same sample is then multiplied by a sample of the cosine wave to form another product which is also output on conductors 113. There are therefore $25.6 \times 10^6$ samples per second output on conductors 113.

The local oscillator 42 has a sine wave ROM 68 that contains at 128 consecutive addresses 128 samples representing equally spaced consecutive points along one period of a sine wave. To produce samples of a sine wave of the selected frequency the address applied to the ROM 68 on conductors 70 is incremented, between each sample produced of the sine wave and the next, by a constant amount depending on the frequency required. The same process is used to produce the cosine wave but with a difference of 32 (i.e. a quarter period) from the addresses producing the sine wave.

In detail, the oscillator 42 operates as follows. In each cycle of the 25.6 MHz clock signal 61 an adder 67 adds to the address on conductors 70 one of two constants, selected by a selector 66. The addition performed by the adder 67 is modulo 128 so that the address on conductors 70 cycles within the range 0 to 127 producing from the ROM 65 successive periods of the sine wave. When the last sample produced was of the sine wave, selector 66 selects the constant 65 having a value of 32; that therefore advances the address one quarter of the way through the ROM 65 producing, therefore, the sample of the cosine wave corresponding to the same phase as the sample of the sine wave.

When the last sample produced was of the cosine wave, selector 66 selects the sum, produced by an adder 66, of constant 63, having a value of 108, and the channel select signal. The value of 108 is the sum of 96 and 12. The number 96 effects the change from sine to cosine by advancing the address three quarters of a wavelength. The number 12 plus the value of the channel select signal sets the increment of the address between one sample of the sine wave and the next. For example, when the value of the channel select signal is 7 the increment is 19 which results in one period of a sine wave being produced over 128/19 samples, that is to say the frequency of the sine wave produced is $19/128 \times 12.8$ MHz $= 1.9$ MHz. Generally the frequency of the sine and cosine waves produced is $(1.2 + 0.1 \, n)$ MHz, where n is a number between 0 and 39.

The remaining blocks of the circuit of FIG. 3 perform part of the functions of low pass filters 45 and 46. The blocks form three integration stages 73,74,75 and a decimation stage 114. The integration stages, 73,74,75 are connected in series. They integrate three times the digital signals on conductors 113, that is to say the products of the lower intermediate frequency signal samples and the samples of the sine and cosine waves. The integrations of the products with the sine samples take place separately from but interleaved with the integrations of the products with the cosine samples.

In detail, the first integration stage operates as follows. Sine and cosine product samples are received on conductors 113 by an adder 78 which alternately adds sine product samples to the sum of all previous sine product samples and adds cosine product samples to the sum of all previous cosine product samples. The sums of all sine and cosine product samples are stored respectively in delay latches 81 and 82 which store their respective sums received from the adder 78 for one cycle of a 12.8 MHz clock signal 38 before supplying them back to the adder 78 to be added to the next sine or cosine product sample as the case may be.

The second integration stage is similar to the first using an adder 79 to sum the previously formed sums of sine and cosine samples produced in the first integration stage after reduction of those sums by a scaler 83. Like the first integration stage, the second integration stage uses delay latches here numbered 85 and 86.

The third integration stage is also of a similar construction to the first two having an adder 80 and delay latches 87,88 and is connected to sum the two alternating sequences of sums calculated by the second stage. Between the second and third stages there is also a scaler 84. The three stages are pipelined so that, for example, while adder 78 sums sine product samples, the adder 79 sums previously formed sums of cosine product samples and the adder 80 sums previously formed sums of previously formed sums of sine product samples.

The thrice integrated sequences of sine and cosine product samples, output by adder 80, are respectively decimated by decimation latches 76 and 77 which latch in response to a 400 kHZ clock signal derived by a "divide by 64" circuit 89 from the 25.6 MHz clock signal and produced on conductors 115 and 116. The clock signal on the conductor 116 fed to the decimation latch 77 is delayed by one cycle of the 25.6 MHz clock sample relative to the clock signal on the conductor 115 fed to the latch 76 because the sine samples output by adder 80 alternate with the cosine type samples.

The scalers 83 and 84 serve to reduce the amplitude of the digital signals passed from one stage of integration to the next in order to prevent excessive overflow of adders 79 and 80 which otherwise might occur since each integration causes the amplitude of the digital signals to build up. The scalers work by discarding some of the least significant bits of the digital signals.

A certain amount of overflow can be tolerated and in some cases the scalers can be omitted from the circuit. That is because the digital signals are differentiated after passing through the decimation latches, which means that if adder 84 overflows at most once between each subtraction arising in the differentiation (described below) then the results of those subtractions will be unaffected.

FIG. 4 is a diagram showing the timing of outputs of various of the components of the circuit of FIG. 3 and other signals in that circuit. The diagram illustrates the way in which samples are pipelined through the circuit with the sine and cosine values and their products occurring alternately.

The signals represented in FIG. 4 are as follows, taking them in order from the top of the Figure:
1. The 25.6 MHz clock signal on the conductor 61.
2. The 12.8 MHz clock signal on the conductor 38.

3. The times at which values 108+channel number and 32 are output by the selector 66.
4. The times of output of the successive samples of the sine and cosine waveforms stored in the latch 69.
5. The arrival of the successive samples of the lower intermediate frequency signal at the input of the multiplier.
6. The products $P_{s,n}$ and $P_{c,n}$ of the sine and cosine samples and the $n^{th}$ lower intermediate frequency sample respectively produced as successive outputs of the multiplier 111.
7. The output of the adder 78. The symbol $I_{l,s,n}$ marks the first integral of the products $P_{s,n}$ and $I_{l,c,n}$ the first integral of the products $P_{c,n}$.
8. The output of the adder 79. The symbol $I_{2,s,n}$ marks the second integral of the products $P_{s,n}$ and $I_{2,c,n}$ the second integral of the products $P_{c,n}$.
9. The output of the adder 80. The symbol $I_{3,s,n}$ marks the third integral of the products $P_{s,n}$ and $I_{3,c,n}$ the third integral of the products $P_{c,n}$.

The samples of the lower intermediate frequency signal change at the rising edges of the 12.8 MHz signal and the samples of the other signals change at the rising edges of the 25.6 MHz signal.

From the diagram it can be seen that multiplier 111 and adder 79 alternate with adders 78 and 80 in processing samples of the sine waveform and values derived therefrom and that it takes five cycles of the 25.6 MHz clock from when a sample of the low intermediate frequency signal, sample n, is first presented to multiplier 201 to when the result $I_{3,c,n}$ of the third integration of the product of sample n and a cosine sample Cos n, $P_{c,n}$ is produced.

Figure 5:
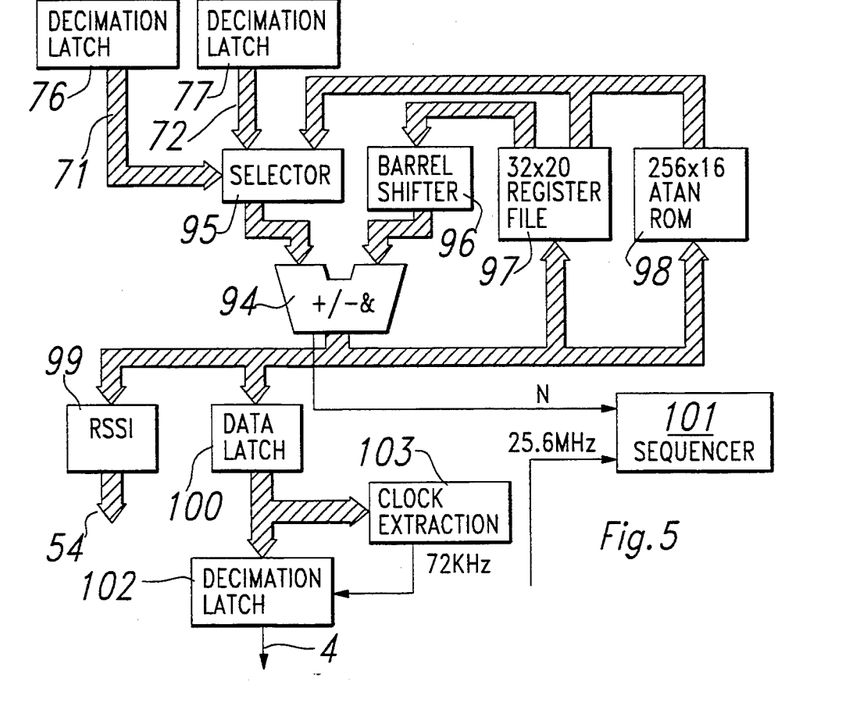
FIG. 5 is a block diagram of the parts of the block 41 of FIG. 1 that perform the final operations on the signal processed in that block.

FIG. 5 shows the circuit that performs the remaining operations on the streams of values produced as outputs, on conductors 71,72, from the decimation latches 76 and 77 (shown in FIGS. 3 and 4) to complete the low pass filtering of the received signals performed by the low pass filters 45 and 46 in FIG. 1. It also provides the rectangular to polar conversion performed by the converter 47, the differentiation by the differentiator 48 and the function of the sign block 56, all in FIG. 1.

The circuit of FIG. 5 further includes a selector 95, a barrel shifter 96, a register file 97, an arc tangent ROM 98, amplitude and data registers 99,100, a sequencer 101, a decimation latch 102 and a clock extraction block 103. The register file 97 holds intermediate values produced during the calculations performed by the circuit, having an input to receive results from the arithmetic unit 94 and two outputs supplying the two inputs of the arithmetic unit 94. The first output of the file 97 is connected to the arithmetic unit 94 via the selector 95 and the second via the barrel shifter 96. The arc tangent ROM 98 has an input connected to receive an address signal calculated by the arithmetic unit 94 and an output for supplying an arc tangent value to the arithmetic unit 94 via the selector 95. The selector 95 also has inputs from the decimation latches 76, 77; it selects from among the decimation latches, the first output of the register file 97 and the output of the arc tangent ROM 98, the value to be passed to the first input of the arithmetic unit 94.

The sequencer 101 provides control signals to the other parts of the circuit of FIG. 5 to coordinate their operation so that they perform their functions correctly.

To complete the low pass filtering of the streams on conductors 71 and 72 the circuit of FIG. 5 differentiates those streams with respect to time. Each stream is differentiated three times with intermediate results being stored in the register file 97. To ensure that the frequency response of the comb filter 45, 46 has zeros at 100 kHz intervals, each sample of a stream has subtracted from it the fourth previous sample of that stream. That is, the samples that are subtracted are separated in time by $10^{-5}$ seconds.

The first differentiation is of the streams received from the circuit of FIG. 3 via the decimation latches 76, 77. However, because of the four sample delay before subtraction the last four samples of each of the streams have to be stored in the register file 97, their transfer from the decimation latch to the register file 97 being via arithmetic unit 94 which is instructed by the sequencer 101 to perform no operation on the values. The "no operation" instruction is also used when transferring values between registers of the register file 97 since those transfers also take place via the arithmetic unit 94.

For the second and third differentiations each sample of the streams resulting from the previous differentiation has subtracted from it the fourth previous sample of its respective stream. Therefore each of these differentiations will also require four locations in the register file. In every cycle of the 400 KHz clock, the circuit of FIG. 5 calculates the differences for each stream to form the quadrature components 52, 53 (FIG. 1) of the baseband signal. However, since each operation involving the arithmetic unit 94 takes one cycle of the 25.6 MHz clock signal there is an interval of time before another sample is presented in each of the decimation latches. In that interval the values, just calculated, of the quadrature components 52, 53 of the baseband signal are converted, by the circuit of FIG. 5, into a value of the amplitude signal 55 and a value of the digital data stream on conductor 4, an operation that corresponds to that performed by the rectangular to polar converter 47, differentiator 48 and sign block 56, of FIG. 1. The interval of time is too short for the rectangular to polar conversion to be performed accurately by the simple means of FIG. 5 and therefore approximations are used. In practice the approximations do not distort the signal significantly.

The amplitude signal is formed by the sum of two averages, the first being an average of the absolute values of one quadrature component of the baseband signal, the other being an average of the absolute values of the other quadrature component. Both averages and their sum are recalculated each cycle of the 400 KHz clock signal. Each new average is formed by taking from the previous value of that average 1/256th part of that value and then adding 1/256th part of the absolute value of the respective quadrature component calculated in that cycle. The necessary divisions are performed by shifting the values through 8 binary places using the barrel shifter.

The averaging, or low pass filtering, of the absolute values of a quadrature component of the baseband signal is a measure of the amplitude of the baseband signal because it smooths out the fluctuation of that absolute value to a value intermediate between zero and the amplitude of the vector formed by the two quadrature components, the fluctuations occurring as that vector rotates through its 90° and −90° steps that represent the data.

The phase signal, that is the signal on conductors 54 in FIG. 1, is obtained from the latest value of each of quadrature components 52,53. The absolute values of those two values are used to calculate the address in the arc tangent ROM 98 giving the angle in the first quadrant having a tangent equal to the ratio of the two absolute values. That angle is then used to calculate the angle having a tangent equal to the ratio of the signed values of the quadrature components.

The latest value of the amplitude signal is stored in the latch 99. The amplitude value, as described above in relation to FIG. 1, is output on conductors 55 for use in the remainder of the receiver.

The phase signal contains a representation of the digital data stream transmitted in that it has a sequence of increasing values where the original digital data stream had a "1" and a sequence of decreasing values where the original stream had a "0". The original digital data stream is recovered by the differentiator 48 and sign block 56 of FIG. 1.

The circuit of FIG. 5 performs the functions of the differentiator 48 and sign block 56 in the following manner.

Each value of the phase signal has subtracted from it the previous value of that signal. Without the effects of drift on the phase signal, caused for example by the drifting frequencies of oscillation of the oscillators of the transmitter and the receiver, the subtraction, which has the effect of differentiating the phase signal, produces positive values where the original digital data stream had a "1" and negative values where it had a "0". The effects of drift are allowed for by creating a reference level by low pass filtering the differentiated phase signal and subtracting that from the differentiated phase signal.

The values of the resulting signal, which are stored in latch 100, are calculated at a rate of $400 \times 10^3$ values per second. The "1"s and "0"s of the original digital data stream occur at a rate of $72 \times 10^3$ per second. Therefore there appears in the data latch 100 a succession of five or six positive values for each "1" in the original digital data stream and a succession of five or six negative values for each "0". Decimation latch 102 selects from each succession of five or six values a single positive or a single negative value, as the case may be, in response to a 72 kHz clock signal extracted, from the values appearing in the latch 100, by clock extraction block 103. For each value selected the decimation latch 102 outputs on the conductor 4 a "1" if the value is positive and a "0" if it is negative.

While the operation of the receiver has been described in relation to the reception of an MSK signal the receiver described is capable, as is of course desirable, of decoding any FSK signal conforming to the CT2 standard. CT2 requires an FSK signal having a bit rate of 72 kHZ and a pulse change of $+X$ for "1"s and $-X$ for "0"s where X is between 71° and 126°. Clearly the receiver will detect such signals correctly because it takes the sign of the differential of the phase of the signal which is independent of the magnitude of the phase change. In fact, the receiver described will operate with X in the range 0° to 166°.

The barrel shifter 96 has other uses than those mentioned above. It is used in the generation of the address in the arc tangent ROM 98 where it is used to extract the selected groups of four bits from the absolute values of the first and second quadrature components and to combine those bits into the address for the ROM 98.

The base station, the transmitter and receiver circuit of which has been described, can communicate with several handsets at once. The communication with any particular handset will be on a particular one of the 40 CT2 channels, other handsets being allocated different ones of the CT2 channels. As telephone calls are finished and new calls are started the use made of the available channels changes. The transmitter and receiver described enable such changes to be made simply. In order to allocate a new channel to a new call the base station supplies currently unused ones of subcarrier blocks 5 and the blocks 41 each with a channel select signal designating the channel available for the call, and to direct to that selected subcarrier block 5 and from that selected block 41 the digital data streams relating that call.

Sometimes interference may occur on a channel being used. The base station may include a facility to allocate a new channel to a call while it is in progress; that could be achieved simply by providing new channel select signals designating another channel to the subcarrier block 5 and the block 41 already in use for that call. (Of course control information has to be sent to the handset to inform it that the change is to be made.).

Such changes of channel can be accomplished without significant disruption of the communication because the oscillators 21 and 42 are digital circuits so that the changes of frequency can be achieved instantaneously. The analogue oscillator 18 runs at a constant frequency and is not altered for any change of channel frequency.

Although the circuit described above is of a base station, a similar circuit would be used for a handset. Because a handset needs only to communicate on a single channel at any one time it needs only a single subcarrier block 5, and consequently no adder 6, and a single block 41. However the handset will still need to be able to operate on any one of several channels, possibly all 40, and to change channels from time to time.

Although the circuit described above is of a CT2 telephone system similar circuits could be produced for other systems such as GSM, DECT, PCN and PHP. The invention could also be used in a cellular radio telephone or a paging system.

Figure 6:
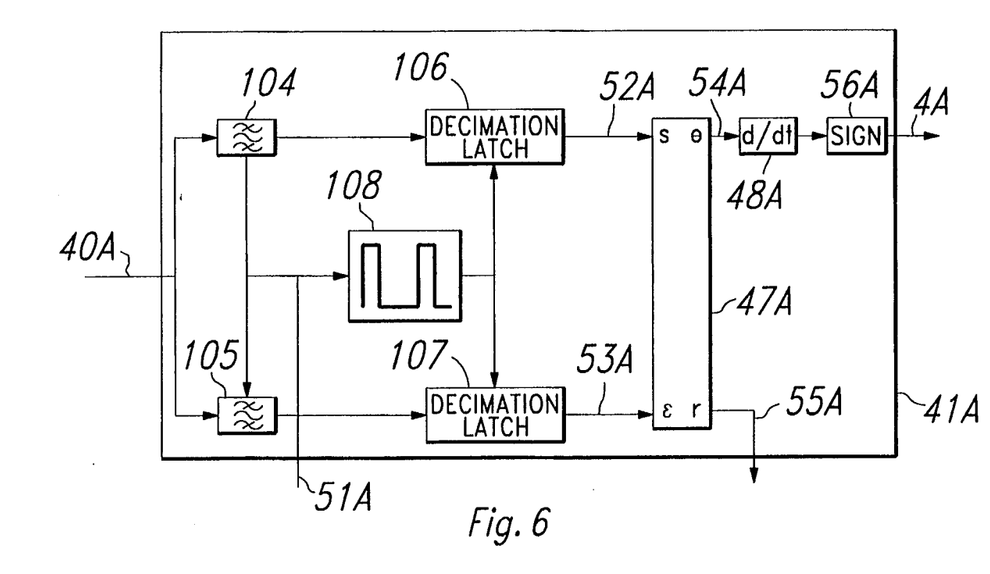
FIG. 6 shows an alternative form of the block 41 of FIG. 1.

FIG. 6 is a block diagram of an alternative circuit for the blocks 41 of FIG. 1. Components of FIG. 6 that correspond to components of the block 41 of FIG. 1 have the same reference numbers with the letter "A". The circuitry like the preferred version described above, receives as inputs the lower intermediate frequency signal on a conductor 40A and a channel select signal on a conductor 51A, and produces on a conductor 4A the digital data stream carried by the channel designated by the channel select signal, and on a conductor 55A an amplitude value of the signals on that channel.

The circuit comprises two digital finite impulse response filters 104, 105, two decimation latches 106, 107 and, as in the preferred version, a rectangular to polar converter 47A, a differentiator 48A and a sign block 56A.

Both finite impulse response filters take as their inputs the lower intermediate frequency signal and have a bandpass frequency response passing only the selected channels. The frequency response is the same for both filters except that the waveforms of the outputs of the two filters differ in phase by 90°. The value of the channel select signal determines which of a number of sets of filter coefficients held in a ROM should be used in the filters 104,105. The outputs of the filters 104,105 are respectively fed to decimation latches 106, 107 which receive the same clock signal from the local oscillator 108. The clock signal is a single bit signal and has as many bit signals per second as there are samples output by the filters 104, 105, namely $12.8 \times 10^6$; all of the clock bit signals are "0" except for those occurring nearest to the ends of successive periods of the selected channel frequency which are "1". At each "1" of the clock signal the decimation latches respectively latch the output values at the time of the filters 104, 105 and continue to output those values on conductors 52A and 53A until the next "1" of the clock signal. The decimation effected by the latches 106, 107 shifts the filtered lower intermediate frequency band output from the filters 104, 105 to baseband and also separates it into quadrature components so that the pair of signals output on conductors 52A and 53A is substantially the same as the quadrature components on conductors 52 and 53 in FIG. 1; block 41A of FIG. 6 completes the demodulation in the same way as the block 41 of FIG. 1. Therefore the remaining blocks in FIG. 6 are the same as those of FIG. 1. The difference between the block 41 of FIG. 1 and the block 41A shown in FIG. 6 is that while they both use a local oscillation or clock signal to perform a frequency shift on the selected channel bringing it to baseband and to produce the required quadrature components, the block 41A uses a single phase of the local clock signal acting on two phases of the selected channel signal whereas the block 41 uses two phases of the local clock signal acting on a single phase of the selected channel signal. Also in the block 41A the channel signal is selected by filtration and then the frequency shift is performed whereas in the block 41 the frequency shift is performed first and then the channel signal is then selected by filtration.

Referring to FIG. 6 it can be seen that a large proportion of the samples calculated by the filters 104 and 105 are discarded during the subsequent decimation process. Much calculation can therefore be saved if the local clock signal generated by the local oscillator 108 is used to cause the filters 104 and 105 to calculate only those values of their outputs for which the clock bit signal is a "1".

The digital part of the transmitter and receiver, that is to say the right-hand part of the circuit shown in FIG. 1, or as modified with reference to FIG. 6, may be constructed as one or more application specific integrated circuits (ASICs) or as a general purpose, or partly specialised digital signal processor with suitable instructions. Integrated circuits may also be used for at least some of the components of the analogue parts of the circuit.

The oscillator 21 used in generating the modulated sub-carrier and the oscillator 42 used in demodulating the received signal after frequency reduction may be the same component, as mentioned above. The merging of the two oscillators is made possible because transmission and reception do not take place simultaneously. In order that the oscillator 42 can operate as the oscillator 21 modification of the circuit represented by the block diagram of FIG. 3 is required, and FIG. 7 shows an example of the modified circuit. To facilitate the understanding of FIG. 7, the layout of components is the same as in FIG. 3 and the same reference numbers are used. Only the differences from FIG. 3 will be described, and the functions of those differences. Some minor simplification of the showing of the channel number input circuit to the adder 67 has been made in FIG. 7, but the operation is unaffected.

In FIG. 7, the analogue signal from the output of the amplifier 36 (FIG. 1) is applied via the analogue to digital converter 39 that provides a 10-bit parallel digital output on conductors 40. That digital output is fed via a selector 200 and conductors 201 to an input of the multiplier 111 when the apparatus is set to receive. Thereafter the received signal is processed as described above with reference to FIG. 3. At that time a scaler/selector 83A operates as the scaler 83 of FIG. 3.

During transmission, the scaler/selector 83A operates as a selector responding to the output of the adder 78 to cause the adder 79 and one or both of the delay latches 85 and 86 to act as a counter. The output of the adder 78 is also applied to the digital-to-analogue converter 11 (of FIG. 1) that produces an analogue output on the conductor 10.

The adder 79 with the latches 85 and 86 operates to accumulate a sample count incremented by one with each step of a modulation phase change, the count being applied via conductors 206 as part of an addressed input to a ROM 203. The remaining bits of the address are provided by a 4-bit transition number over conductors 204 and an I/Q selector bit over conductor 205. The 10-bit output of the ROM 203 is fed via conductors 207, an I/Q latch 208 and conductors 209 to a second input of the selector 200.

During transmission, the sampled speech or data provides the transition number that indicates the change of phase (one bit) and also whether the phase change takes place over 177 or 178 steps (one bit). As described above, each change of phase is of $+90°$ or $-90°$ depending on whether the bit to be transmitted is a "1" or a "0" the phase change being implemented in 177 or 178 steps at a rate of 12.8 MHz. Those steps are counted by the adder 79 and one or both of the latches 85 and 86 receiving an "add 1" signal from the scaler/selector 83A. In practice only one of the latches need be used because both would have the same count. The progression through the 177 or 178 steps is followed by the address input on the conductors 206, so that the ROM 203 provides the corresponding phase signals that are applied to the multiplier 111. In order to generate the phase modulated sub-carrier wave orthogonal phases of that wave are modulated in amplitude by related I and Q values provided by the ROM 203, and the amplitude modulated phases are added together by the adder 78. The I and Q values are handled alternately by the ROM 203 and the latch 208.

We claim:

1. Apparatus for demodulating a carrier signal having a plurality of channels, occupying separate frequency bands, the apparatus including a constant frequency analogue oscillator for producing an oscillation, analogue combining means for combining the oscillation with the carrier signal to produce an intermediate frequency signal carrying the channels in separate frequency bands of lower frequencies than in the carrier signal, analogue to digital conversion means for converting the intermediate frequency signal into a first digital signal, and a channel processing unit comprising a digital oscillator, responsive to a channel select signal, for producing samples of a substantially periodic signal of the frequency of the selected channel in the first digital signal or a sub-multiple of that frequency, and digital combining means for combining samples of the substantially periodic signal with samples of the first digital signal so as to produce a demodulated signal.

2. Apparatus according to claim 1, wherein the analogue to digital conversion means has a sampling rate such that the first digital signal carries the channels in separate frequency bands of lower frequencies than in the intermediate frequency signal.

3. Apparatus according to claim 1 wherein the channel processing unit includes a band pass filter means for filtering the first digital signal, that is responsive to the channel select signal, so that in use, the filtering means removes all but the selected channel from the first digital signal, before the first digital signal is combined with the substantially periodic signal by the digital combining means.

4. Apparatus according to claim 3 wherein the band pass filter means provides two filtered first digital signals differing from each other in phase, and the digital combining means combines each of the two phases of the filtered first digital signal with the substantially periodic signal to provide two resultant signals to form the demodulated signal.

5. Apparatus according to claim 1 wherein the digital oscillator is constructed to produce two phases of the substantially periodic signal, and the digital combining means is constructed to combine the first digital signal separately with each of the two phases of the substantially periodic signal to provide two resultant signals to form the demodulated signal.

6. Apparatus according to claim 4 wherein the channel processing unit includes means for converting the two resultant signals into a signal representing the phase of the modulated signal in the selected channel of the first digital signal.

7. Apparatus according to claim 1 wherein the combining means comprises at least one multiplier for multiplying respective samples of the digital signals.

8. Apparatus according to claim 3 wherein the combining means comprises at least one decimation means that decimates the first digital signal in response to the substantially periodic signal.

9. Apparatus according to claim 1 wherein the combining means comprises a bandpass filter means responsive to the channel select signal so that in use the filter means removes all but the selected channel from the first digital signal, and wherein the filter means decimates the first digital signal, by calculating the output of the filter means only at times determined by the substantially periodic signal.

10. Apparatus according to claims 1 including a plurality of channel processing units each responsive to a different channel select signal.

11. Apparatus for demodulating a carrier signal having a plurality of channels, occupying separate frequency bands, the apparatus including an analogue oscillator for producing an oscillation, combining means for combining the oscillation with the carrier signal to produce an intermediate frequency signal carrying the channels in separate frequency bands of lower frequencies than in the carrier signal, analogue to digital conversion means for converting the intermediate frequency signal into a first digital signal, the analogue to digital conversion means having a sampling rate such that the first digital signal carries the channels in separate frequency bands of lower frequencies than in the intermediate frequency signal, and a channel processing unit comprising a digital oscillator for producing samples of a substantially periodic digital signal,
and digital combining means for combining samples of the substantially periodic digital signal with samples of the first digital signal so as to produce a demodulated signal.

12. A method of demodulating a carrier signal having a plurality of channels, occupying separate frequency bands, the method including combining the carrier signal with a local oscillation so as to produce an intermediate frequency signal carrying the channels in separate frequency bands of lower frequencies than in the carrier signal, sampling the intermediate frequency signal and converting the samples into digital form so as to form a first digital signal and combining the first digital signal, with a substantially periodic signal in digital form, of the frequency of a selected channel in the first digital signal, or a sub-multiple of that frequency, so as to produce a demodulated signal.

13. A method according to claim 12 wherein the sampling of the intermediate frequency signal is at such a rate that the first digital signal carries the channels in separate frequency bands of lower frequencies than in the intermediate frequency signal.

14. A method according to claim 12 wherein a plurality of channels are selected and, for each selected channel, the first digital signal is combined with a substantially periodic signal in digital form of the frequency of that selected channel, or a sub-multiple of that frequency so as to produce a respective demodulated signal.

15. A method according to claim 12 wherein the combining of the first digital signal with a particular substantially periodic signal comprises multiplying the first digital signal by that substantially periodic signal.

16. A method according to claim 15 wherein samples of the first digital signal are combined with successive pairs of samples of the particular substantially periodic signal, the samples of a pair being derived respectively from phases in quadrature of the periodic signal.

17. A method according to claim 15 wherein the demodulated signal resulting from the multiplication is low-pass filtered to pass only the respective selected channel.

18. A method according to claim 16 wherein the two demodulated signals resulting from the multiplication are low pass filtered to pass only the respective selected channel, and wherein those two low-pass filtered signals are combined to produce a signal indicative of the direction of the vector formed by the two low-pass filtered signals taken as an ordered pair.

19. A method according to claim 18 wherein the signal indicative of the direction is differentiated with respect to time.

20. A method according to claim 19 wherein the differentiated signal is low-pass filtered, the low pass filtered signal is subtracted from the differentiated signal to form a resultant signal, and an output signal is derived from the sign of the resultant signal.

21. An oscillator which, in use, produces alternately, at times determined by a clock signal, samples of two different phases of a periodic waveform, the oscillator comprising a memory containing a plurality of addresses at which are stored values representing the amplitude of the waveform at points distributed over at least a part of a period of the waveform during which the waveform assumes all possible values of the amplitude of the waveform and addressing means for reading selected ones of the stored values from the memory, the means including register means for storing an address signal for application to the memory, an adder connected to add the value of the address signal in the register means to the value of an increment signal to produce the value of the next address signal, and to store the next address signal in the register means, and increment means connected to provide as the increment signal alternately a first value representing the phase shift between the two phases and a second value representing the phase shift between the two phases in the opposite sense plus a value representing the phase increment between consecutive samples of each phase of the waveform produced by the oscillator.

22. Apparatus for producing a modulated carrier signal, including a digital oscillator for producing samples of a periodic subcarrier waveform having a frequency determined by a channel select signal, digital combining means for combining the samples of the subcarrier waveform with a modulation signal in digital form to produce a first digital signal carrying the modulation signal in a band at the frequency of the subcarrier frequency, digital to analogue conversion means for converting the first digital signal into a first analogue signal, a constant frequency analogue oscillator for producing a first carrier signal, and mixing means for combining the first analogue signal with the carrier signal to form the modulated carrier signal.

23. Apparatus for producing a modulated carrier signal including, a plurality of digital oscillators each arranged to produce samples of a subcarrier waveform, the subcarrier waveforms produced by the oscillators having different frequencies determined by respective channel select signals, a plurality of digital combining means for combining the individual subcarrier waveforms with respective modulation signals in digital form to produce respective modulated subcarrier waveforms, addition means for adding together all the modulated subcarrier waveforms to form a first digital signal, digital to analogue conversion means for converting the first digital signal to a first analogue signal, a constant frequency analogue oscillator for producing a carrier signal, and mixing means for combining the first analogue signal with the carrier signal to form the modulated carrier signal.

24. Apparatus according to claim 22 wherein the digital to analogue conversion means comprises a digital to analogue converter for converting the first digital signal into an analogue signal at the same frequency as the first digital signal, chopping means connected to receive the analogue signal and producing a succession of short duration samples of the instantaneous amplitude of the analogue signal, and band-pass filter means responsive to the samples produced by the chopping means to generate an output signal having a frequency in a band of frequencies equal to a harmonic of the sampling frequency of the chopping means plus the frequency of the subcarrier waveform.

25. Apparatus according to claim 22 wherein the digital combining means has an associated means for producing from an input signal, first and second digital signals representing two components of a phase modulation signal vector, and wherein the digital combining means comprises first and second multipliers for multiplying the samples of the periodic subcarrier waveform by samples of the first and second digital signals respectively and adder means for adding together the products produced by the first and second multipliers.

* * * * *